(12) United States Patent
Breit et al.

(10) Patent No.: US 6,995,409 B2
(45) Date of Patent: Feb. 7, 2006

(54) MODULE FOR HIGH VOLTAGE POWER FOR CONVERTING A BASE OF IGBT COMPONENTS

(75) Inventors: Fabrice Breit, Campan (FR); Thierry Lebey, Lacroix Falgarde (FR)

(73) Assignee: Alstom, Levallois-Perret Cedex (FR)

( * ) Notice: Subject to any disclaimer, the term of this patent is extended or adjusted under 35 U.S.C. 154(b) by 0 days.

(21) Appl. No.: 10/858,293

(22) Filed: Jun. 1, 2004

(65) Prior Publication Data
US 2005/0017264 A1 Jan. 27, 2005

(30) Foreign Application Priority Data
Jun. 4, 2003 (FR) .................................. 03 06748

(51) Int. Cl.
  *H01L 29/74* (2006.01)
(52) U.S. Cl. .................. 257/177; 257/150; 257/181; 257/182; 257/686; 257/700; 257/706; 257/712; 257/713
(58) Field of Classification Search .............. 257/146, 257/150, 177, 151, 181, 178, 182, 685, 686, 257/700, 706, 712, 713, 714
See application file for complete search history.

(56) References Cited

U.S. PATENT DOCUMENTS 5,574,312 A    11/1996   Bayerer et al.
6,060,795 A     5/2000   Azotea et al.
2003/0090873 A1 5/2003   Ohkouchi

FOREIGN PATENT DOCUMENTS

EP    1 162 719    12/2001
EP    1 172 850     1/2002
EP    1 318 547     6/2003

OTHER PUBLICATIONS

Design Optimization of an Integrated Liquid-Cooled IGBT Power Module Using CFB Technique—Tien-Yo (Tom) Lee—(pp. 55-60—XP-000924185)—IEEE Transactions of Components and Packaging Technologies, vol. 23, No. 1—Mar. 2000).

*Primary Examiner*—Minhloan Tran
*Assistant Examiner*—Tan Tran
(74) *Attorney, Agent, or Firm*—Arthur E. Fournier, Jr.

(57) ABSTRACT

This power switching cell comprises:
  at least two power components (4–6) forming a chain (2) of components electrically linked in series by way of at least one intermediate bond (52, 70), and
  a dielectric substrate inside which are incorporated said at least two components (4–6).

Each intermediate bond (52, 70) as well as the faces of the components linked to this intermediate bond are entirely incorporated inside said substrate, and the faces not linked to an intermediate bond (52, 70) of the components situated at the ends of said chain (2) are disposed in such a way as to be separated from one another by way of the dielectric material forming said substrate (22). This substrate is formed of a stack of parallel sheets (24–27) of dielectric material, and each of the components (4–6) following in said chain is incorporated in the thickness of a different sheet.

15 Claims, 6 Drawing Sheets

MODULE FOR HIGH VOLTAGE POWER FOR CONVERTING A BASE OF IGBT COMPONENTS

BACKGROUND OF THE INVENTION

The invention relates to a power switching cell and to a process for fabricating this cell.

More precisely, the invention relates to a switching cell comprising:

- at least two power components each exhibiting a first face equipped with at least one electrical bonding terminal and one opposite second face equipped with at least one other electrical bonding terminal, these components forming a chain of components electrically linked in series by way of at least one intermediate bond, each intermediate bond electrically connecting the second face of the previous component to the first face of the next component in said chain, and
- a dielectric substrate inside which are incorporated said at least two components.

Such switching cells are, for example, frequently used to make inverters intended to power electric motors used for pulling trains. In such applications, the switching cell must be capable of switching currents greater than a thousand amperes and of withstanding voltages of greater than five thousand volts. To achieve such performance and in particular to resist such voltages, each switching cell is made from several elementary interrupters such as IGBT transistors, linked together in series.

Moreover, today, the CPES (Center for Power Electronics System (CPES), Virginia Tech., 657 Whittemore Hall (0111), Blacksburg, Va. 24061) has disclosed a process for incorporating transistors working at less than 600 volts, inside a substrate. For example, in the article "Embedded Power—An Integration Packaging Technology for IPEMs" by the authors Zhenxian Liang, Fred C. Lee and G. Q. Lu, a copy of which may be obtained from the CPES, a first transistor IGBT1 and a second transistor IGBT2 linked in series are both incorporated in the thickness of a horizontal sheet of dielectric material. The upper face of each of these transistors, which face is equipped with gate and emitter bonding terminals, points upward, whereas the lower face, equipped with a bonding terminal for the collector, points downward. To link these two transistors in series, it is therefore necessary to electrically link, for example the emitter of the transistor IGBT1 to the collector of the transistor IGBT2. This connection is called here an intermediate bond. Since the emitter of the transistor IGBT1 is on the upper face of the sheet, whereas the collector of the transistor IGBT2 is on the lower face of the sheet, this connection must cross the substrate. On the upper face of the sheet there therefore exist at least two different potentials Ve1 and Ve2 corresponding respectively to the potentials of the emitters of the transistors IGBT1 and IGBT2. Likewise, on the lower face of the sheet, there also exist two different potentials Vc1 and Vc2 corresponding respectively to the potentials of the collectors of the transistors IGBT1 and IGBT2. Since these two transistors are linked in series, the voltage Ve1 is equal to the voltage Vc2.

Due to the presence of various potentials on the same face of the substrate, the first and the second transistors have to be spaced apart by a minimum insulation distance. Below this minimum insulation distance there is a risk of a short-circuit being established between these two potentials, either by breakdown of the surrounding air, or by routing to the surface of the substrate. This insulation distance is therefore dependent both on the dielectric properties of air and on the value of the various potentials.

Hence, when one wishes to apply this technology to make power switching cells capable of working at voltages of several thousand volts, the minimum insulation distance to be complied with increases and the footprint of the switching cell likewise. This is a brake to the application of the teaching of the CPES article in the medium voltage sector.

SUMMARY OF THE INVENTION

Thus, the invention is aimed at improving the component integration techniques developed by the CPES in such a way as to be able to apply this technology to power components in the medium voltage sector.

A subject of the invention is therefore a power switching cell as described hereinabove wherein:

- the or each intermediate bond, as well as those faces of the components that are linked to this intermediate bond, are entirely incorporated inside said substrate, and
- the faces not linked to an intermediate bond of the components situated at the ends of said chain are disposed in such a way as to be separated from one another by way of the dielectric material forming said substrate in which they are incorporated. Short-circuits by routing to the surface of the substrate therefore no longer exist.

In the above cell, the potential of each intermediate bond is insulated from the various potentials present at other points of the same chain by way of the dielectric material forming the substrate in which these components are incorporated. Short-circuits by routing to the surface of the substrate therefore no longer exist.

This dielectric material exhibits a greater resistance to breakdown than that of air so that the minimum distance to be provided between two successive components of said chain can be reduced. Hence, by additionally incorporating the intermediate bond into the substrate, it becomes possible to apply the teaching of the CPES article to power components intended to work in medium voltages while still obtaining a cell whose footprint remains reasonable.

According to other characteristics of a cell in accordance with the invention:

- the faces not linked to an intermediate bond of the components situated at the ends of said chain point in different directions in such a way that the shortest path between these two faces crosses the dielectric material forming said substrate in which they are incorporated;
- the substrate is formed of a stack of parallel sheets of dielectric material, and wherein each of the components following in said chain is incorporated in the thickness of a different sheet;
- the first and second faces of each component are parallel to the faces of the sheet in which the component is incorporated;
- at least one of the first and second faces of each component is flush with one side of the sheet in which the component is incorporated;
- said intermediate bond between two components is formed by an electrical track etched on at least one of the faces of the sheet in which one of these two components is incorporated;
- at least one of the two components of said chain is soldered to said etched electrical track;

it comprises at least one channel for circulating a cooling fluid fashioned inside said substrate so as to cool at least one of the components incorporated in this substrate;

it comprises several channels for circulating a cooling fluid, and wherein each power component is interposed between at least two of these channels in such a way that its first and its second face are cooled by these channels;

it comprises at least one channel for circulating a cooling fluid fashioned in each sheet forming said substrate;

said at least one channel fashioned in each sheet is situated beneath the or each component soldered on the face of this sheet;

the substrate exhibits at least one first and one second opposite faces;

the cell comprises an electrical bonding tag linked to the first face of the first component, of said chain and a second electrical bonding tag linked to the second face of the last component of said chain, and the first and second tags project respectively from the first and second opposite faces;

the substrate exhibits a third face different from the first and second faces;

the cell comprises at least one third electrical bonding tag linked to an intermediate bond and this third tag projects from the third face;

the components are power transistors;

the substrate is of parallelepipedal shape;

the sheets, incorporating the components, are all of identical size.

A subject of the invention is also a process for fabricating a switching cell in accordance with the invention, which process comprises:

a phase of fabricating elementary blocks, each elementary block being formed of a sheet of the substrate, onto which sheet is soldered one of the power components and in which sheet is fashioned a through-hole intended to receive the power component of another identical elementary block, and a phase of assemblage during which the elementary blocks are stacked one above the other to form said switching cell.

BRIEF DESCRIPTION OF THE DRAWINGS

The invention will be better understood on reading the description which follows, given merely by way of example and while referring to the drawings in which.

DETAILED DESCRIPTION OF THE PREFERRED EMBODIMENT

Figure 1:
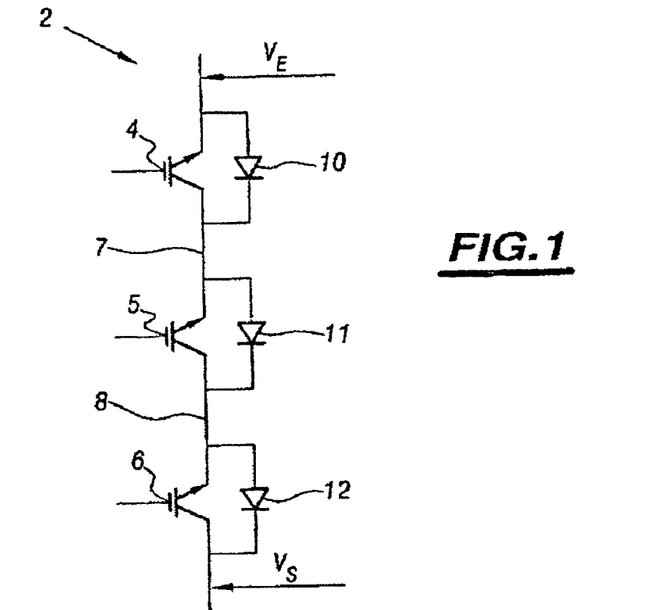
FIG. 1 is an electrical diagram of a chain of three power components.

FIG. 1 represents a chain 2 formed of three IGBT (Insulated Gate Bipolar Transistor) transistors 4, 5 and 6 linked in series between an input potential Ve and an output potential Vs. The emitter of the transistor 4 is linked to the potential Ve, while the collector of the transistor 6 is linked to the potential Vs. Intermediate bonds 7 and 8 directly link, respectively, the emitter of the transistor 5 to the collector of the transistor 4 and the emitter of the transistor 6 to the collector of the transistor 5.

Three diodes 10, 11 and 12 are each linked in anti-parallel position to the terminals respectively of the transistors 4, 5 and 6. This chain corresponds, for example, to the electrical diagram of a switching cell intended to form one of the two interrupters of one of the arms of a three-phase inverter suitable for powering the electric traction motor for pulling a train.

Figure 2:
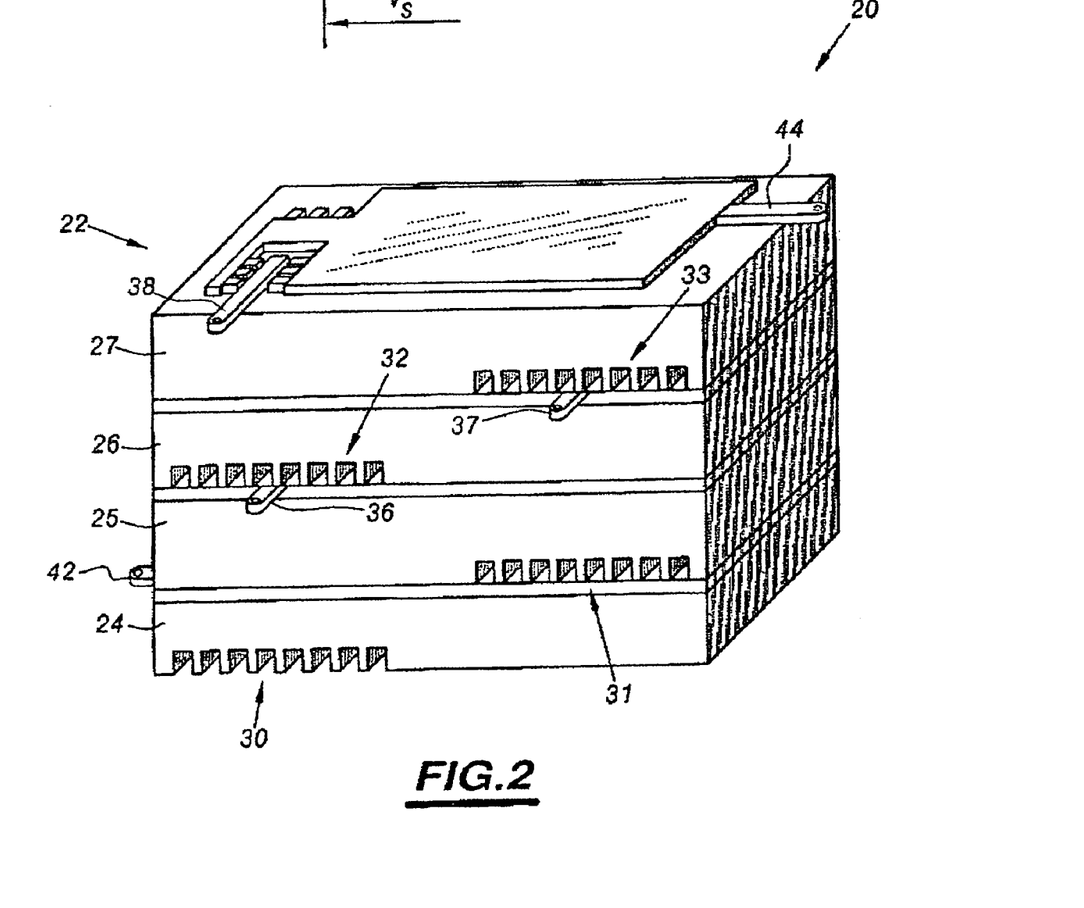
FIG. 2 is a diagrammatic illustration in perspective of a switching cell in accordance with the invention.

FIG. 2 represents a switching cell, designated by the general reference 20, corresponding to the electrical diagram of FIG. 1.

This cell is formed of a substrate 22 of dielectric material of substantially parallelepipedal shape inside which are incorporated the transistors 4 to 6 and the diodes 10 to 12 of FIG. 1. The substrate 22 is formed by a stack of 4 horizontal sheets 24 to 27 of thermally conducting dielectric material such as alumina, aluminum nitride or diamond. Inside each sheet 25 to 27 are incorporated a transistor and its antiparallel diode. More precisely, the sheets 25, 26 and 27 respectively incorporate the transistor 6 and its diode 12, the transistor 5 and its diode 11, and the transistor 4 and its diode 10.

Each sheet 24 to 27 has the shape of a right-angled parallelepiped on the upper face of which are etched electrical tracks which will be described in greater detail with regard to FIG. 3. On the lower face of each of these sheets 24 to 27 is fashioned a group, respectively 30 to 33, of channels for circulating a cooling fluid. These channels cross right through the substrate 22 from the front face to the rear face of the parallelepiped and run parallel to the side faces of the substrate 22. Here, each group comprises eight channels spaced 2 mm apart and 0.5 mm deep.

Here, bonding tags 36 to 38 linked respectively to the gates of the transistors 4 to 6 project horizontally outward from the front face of the substrate 22.

The cell 20 also comprises power bonding tags 42 and 44 linked respectively to the collector of the transistor 6 and to the emitter of the transistor 4. These tags 42 and 44 project outward from the opposite faces of the substrate 22, that is to say here the vertical face on the left side and the vertical face on the right side of the substrate 22.

The tags 36 to 38 are intended to be linked to a unit for controlling the switching of the transistors 4 to 6. The tags 42 and 44 are intended respectively to be linked to the potentials Vs and Ve.

Finally, interposed between each sheet, the substrate 22 comprises connection layers intended to rigidly fix the sheets together, which will be described in greater detail with regard to FIG. 4.

Figure 3:
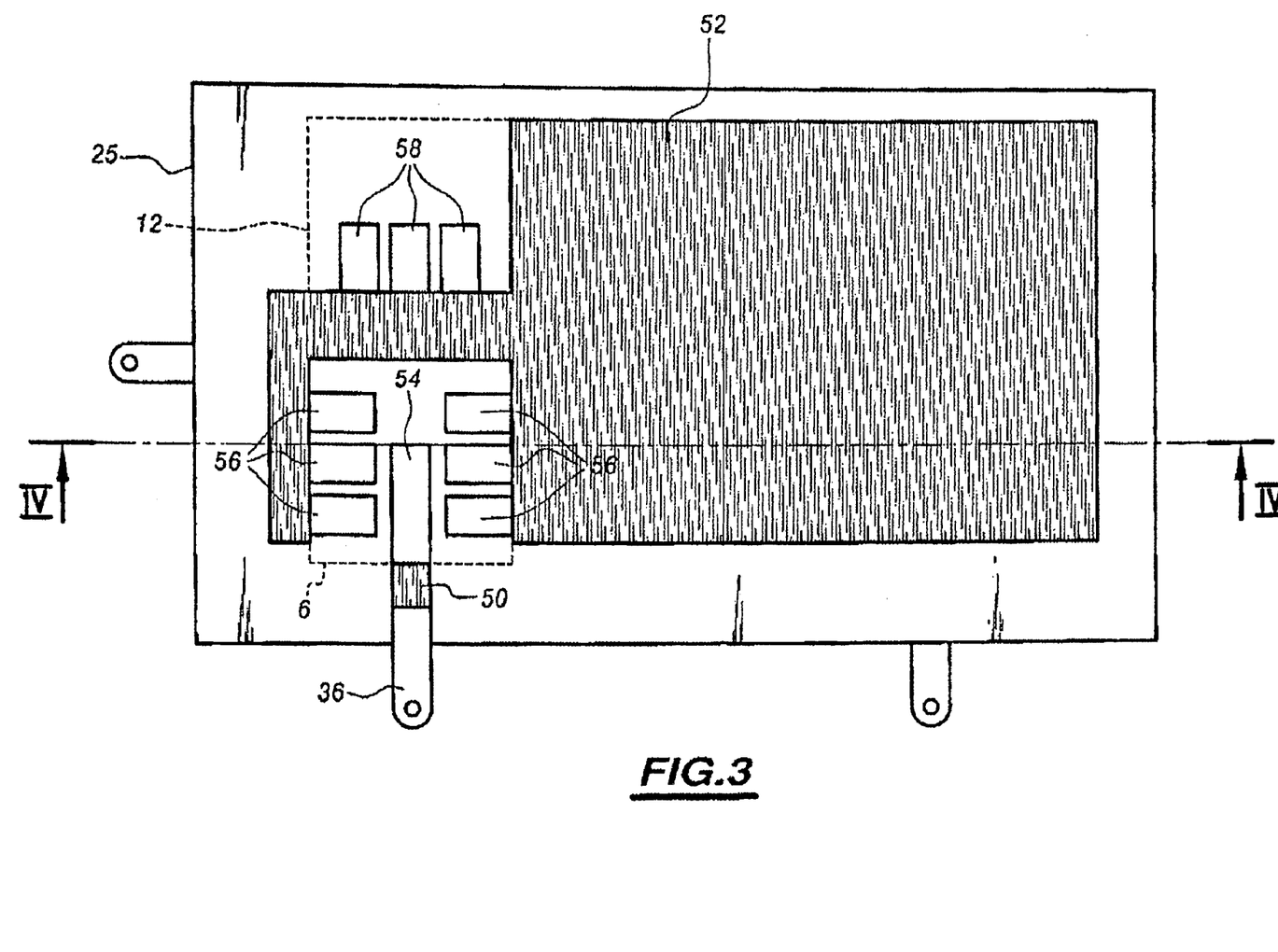
FIGS. 3 and 4 are sectional views respectively along the lines III—III and IV—IV of the switching cell of FIG. 2.

FIG. 3 represents a view from above of the upper face of the sheet 25.

The two dashed squares respectively represent the location at which the transistor 6 and the anti-parallel diode 12 are incorporated in this sheet 25.

On this upper face, two electrical tracks 50 and 52, for example made of copper, are etched. The track 50 extends from a point 54 of bonding to the gate of the transistor 6 to a point of linkage with the tag 36.

The track 52 is intended to link the emitter of the transistor 6 and the anode of the diode 12 to the collector of the transistor 5 and to the cathode of the diode 11 to form the intermediate bond 8. For this purpose, the track 52 runs from points 56 of bonding to the emitter of the transistor 6 and from points 58 of bonding to the anode of the diode 12. The track 52 additionally exhibits a sufficiently extensive surface area for the collector of the transistor 5 to be able to be soldered to this area and the cathode of the diode 11. The surface area of the track 52 is chosen to be as large as possible so as to diffuse and dissipate the heat of the transistor 5.

In a manner similar to what was described for the sheet 25, electrical tracks are etched onto each of the upper faces of the sheets 24, 26 and 27 in such a way as to form the electrical bonds of the chain 2. These electrical tracks are described in greater detail with regard to FIG. 4.

Figure 4:
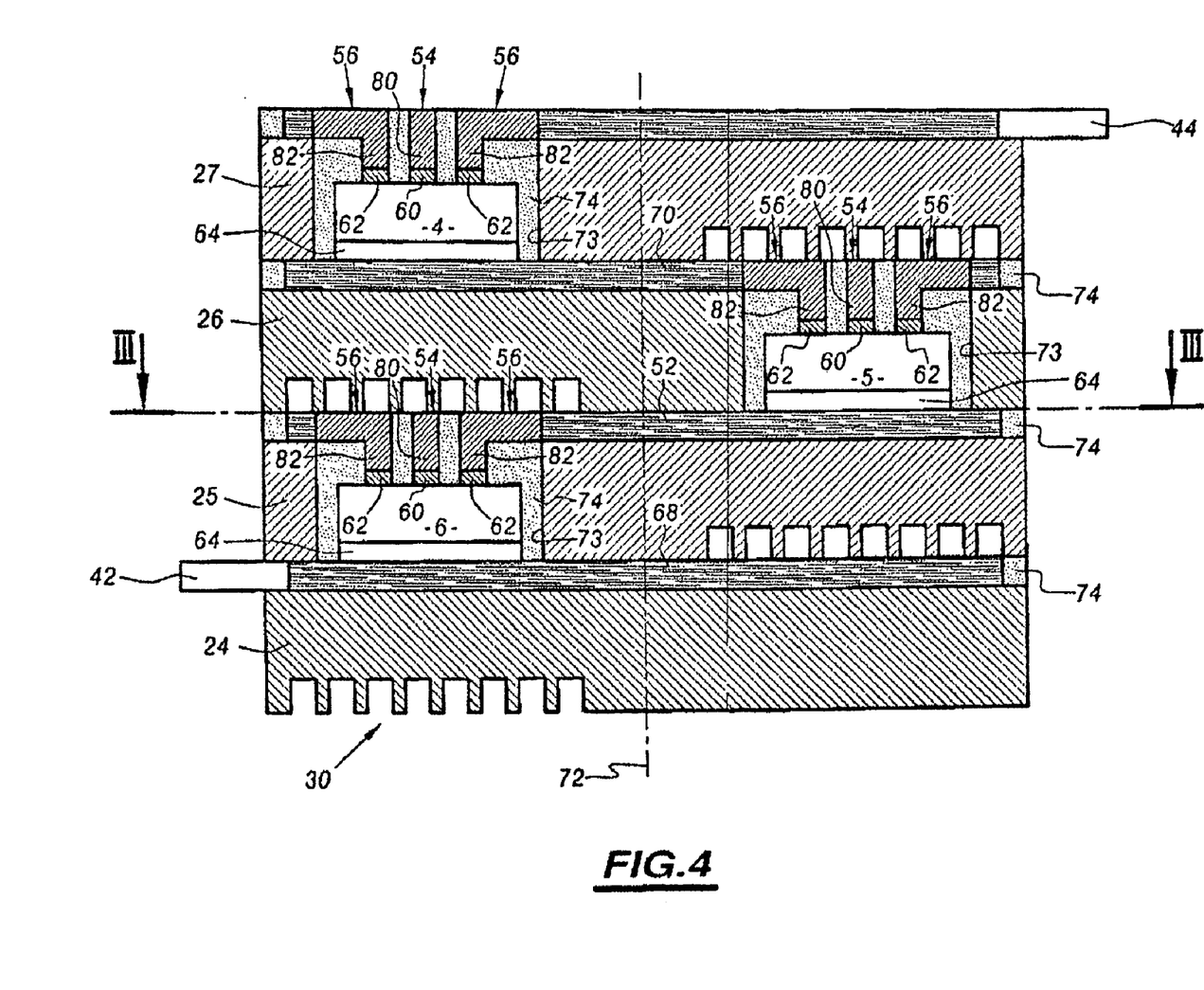

FIG. 4 represents a vertical section along the line IV—IV of the substrate 22.

In the structure of the cell 1, each transistor 4, 5, 6 is incorporated in a sheet of dielectric material, for example by implementing the process described in the CPES article referenced above.

The power components incorporated in these sheets each exhibit an upper face and a lower face that are equipped with respective bonding terminals. For example, in the case of the transistors 4, 5 and 6, the upper face comprises a terminal 60 for bonding to the gate of the transistor and six terminals 62 for bonding to the emitter of the transistor. In this sectional view, only two terminals 62 are visible for each transistor.

The lower face of each transistor comprises a terminal 64 for bonding of the collector of the transistor running substantially throughout the lower surface of the transistor.

Similarly, the diodes 10 to 12 take the form of a component exhibiting an upper face carrying three terminals for bonding the anode and a lower face carrying a terminal for bonding the cathode (not represented). Only the interlinking of the transistors is represented in detail in FIG. 4. The linking of the diodes in series is similar to that of the transistors and is deduced from the explanations given hereinbelow.

A transistor and its diode linked in anti-parallel position that are incorporated in one and the same sheet form a group of components. These groups are disposed alternately on the right and on the left of a vertical midplane 72 in such a way that it is possible to dispose a group of channels for circulating a cooling fluid beneath each successive group in the chain 2. The plane 72 is perpendicular to the plane of FIG. 4. Here, the transistors 4 and 6 are disposed on the left of this plane, while the transistor 5 is disposed on the right.

On the upper face of the sheet 24 is etched an electrical track 68 to which the collector 64 of the transistor 6 and the cathode of the diode 12 are brazed. This track 68 is also linked by brazing or soldering to the tag 42.

No power component is incorporated in this sheet 24 situated at the lower end of the stack.

The collector 64 of the transistor 5 and the cathode of the diode 11 are brazed to the track 52 of the sheet 25 on the right of the plane 72.

The collector 64 of the transistor 4 and the cathode of the diode 10 are brazed to a track 70 etched on the upper face of the sheet 26. The upper face of the sheet 26 is the symmetrical counterpart of the upper face of the sheet 25 with respect to the plane 72 so that the track 70 forms the intermediate bond 7.

The upper face of the sheet 27 situated at the upper end of the stack is identical to that of the sheet 26 with the exception of the fact that the track linked to the emitter of the transistor 4 is also linked to the tag 44 and that no transistor or diode is brazed to this face.

Each group of channels 30 to 33 is here hollowed out in the corresponding sheet from the lower face of the latter situated just beneath the place where the transistor and the diode are soldered to its upper face.

By way of illustration, the sheets 24 to 27 are all of constant thickness equal to 1 millimeter or more and the transistors 4 to 6 are all identical and exhibit a thickness of around 500 micrometers. The thickness of the tracks 52, 68 and 70 is here 100 micrometers.

Each transistor and diode are housed in respective through-holes 73 crossing the sheet in which they are incorporated. Inside their respective holes, the transistor and the diode are disposed in such a way that the terminal 64, respectively the cathode, is parallel and flush with the lower face of this sheet. Conversely, the terminals 60 and 62 of the transistor, respectively the anode of the diode, are situated in a plane parallel to the upper face but situated beneath the level of the upper face in such a way that the terminals 60 and 62 as well as the anode are entirely incorporated inside the sheet. The transistors and diodes are fixed in this position with the aid of an insulating resin 74 disposed between the outer surface of the transistor and of the diode and the inner surface of the holes 73 in which they are housed.

This insulating resin 74 is also spread between two successive sheets of the stack in such a way as to electrically insulate the tracks 52, 68 and 70, as well as the points of bonding 54, 56 from the outside environment. In particular, this deposition of insulating resin ensures electrical insulation between the bonding points 54 and 56 and the groups of cooling fluid circulating channels.

For each transistor and diode incorporated in a sheet, the bonding points 54, 56 and 58 are formed by depositing conducting material between, on the one hand, the bonding terminals on the upper face of the transistor or of the diode and, on the other hand, the corresponding tracks etched on the upper face of this sheet.

Each bonding point comprises a vertical rectilinear portion corresponding to a well filled with conducting material. Here, a well 82 is formed between the upper face of the sheet in which a transistor is incorporated and the bonding terminals 62 of this transistor. Similarly, a well 80 is formed between the upper face of each sheet incorporating a transistor and the bonding terminal 60 for the gate of this transistor.

A process of fabricating the switching cell 20 will now be described with regard to the process of FIG. 5 and FIGS. 6A to 6F in the particular case of a switching cell comprising three transistors linked in series.

Figure 5:
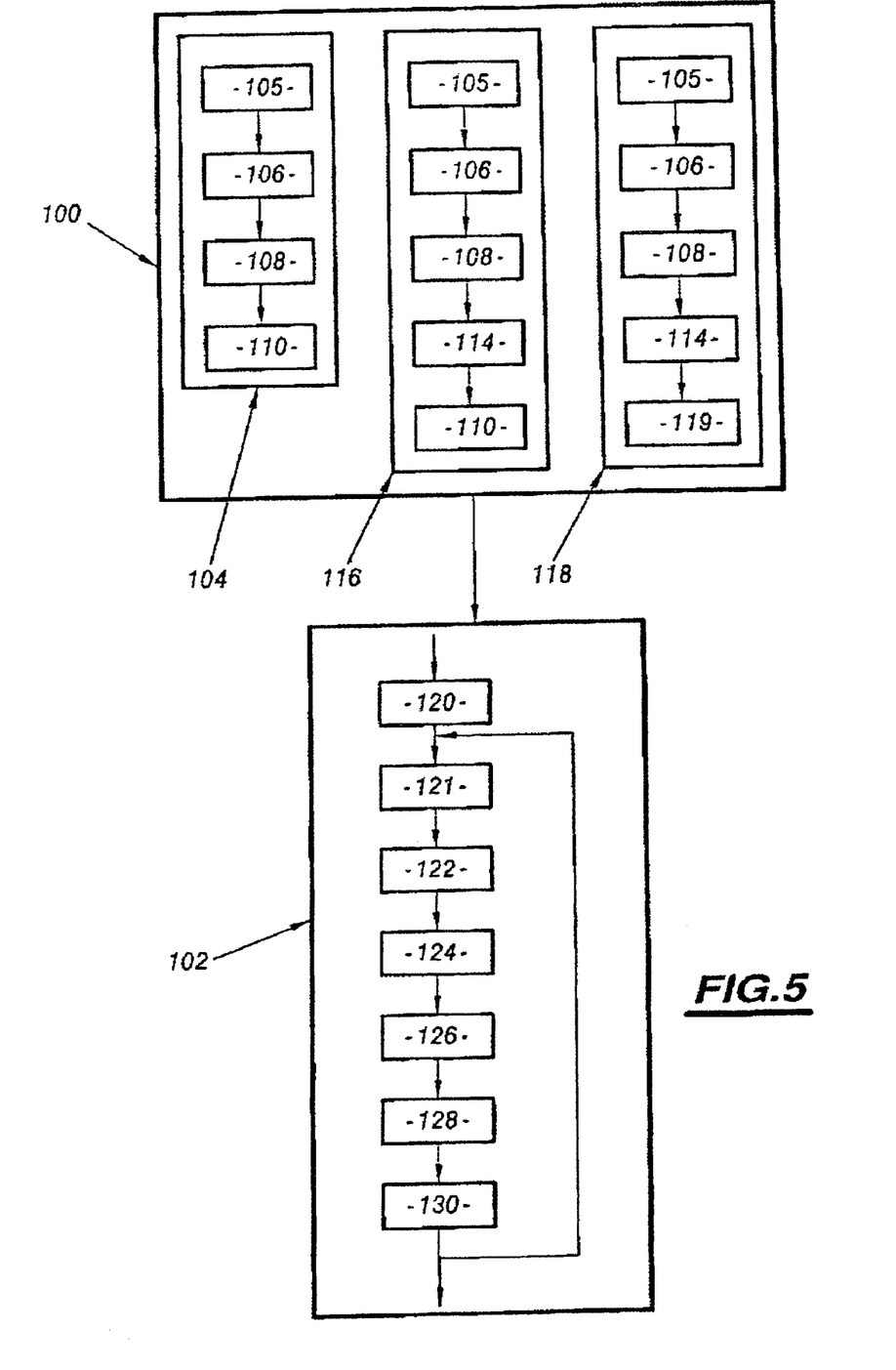
FIG. 5 is a routingchart of a process for fabricating the cell of FIG. 1, FIGS. 6A to 6F are diagrammatic illustrations of the cell of FIG. 2 at various stages of fabrication.

The process is carried out in two main phases. Firstly a phase 100 of fabricating standard elementary blocks, followed by a phase 102 of assembling these elementary blocks to form the cell 20.

During phase 100, base blocks corresponding to the sheet 24 associated with the transistor 6 and with the diode 12 are fabricated during a step 104.

During this step 104, a conventional support for electrical components is cut out, during an operation 105, to a standard format. A conventional support such as this takes the form of a layer of dielectric material exhibiting a copper-plated upper face intended to be etched. Thereafter, the group 30 of channels is hollowed out, during an operation 106, on the lower face of the support.

The copper-plated surface of the board is etched, during an operation 108, to form the track 68 and the transistor 6 and the diode 12 are brazed during an operation 110 to the track 68. During the operation 110, the tag 42 is also soldered with the track 68.

Figure 6A:
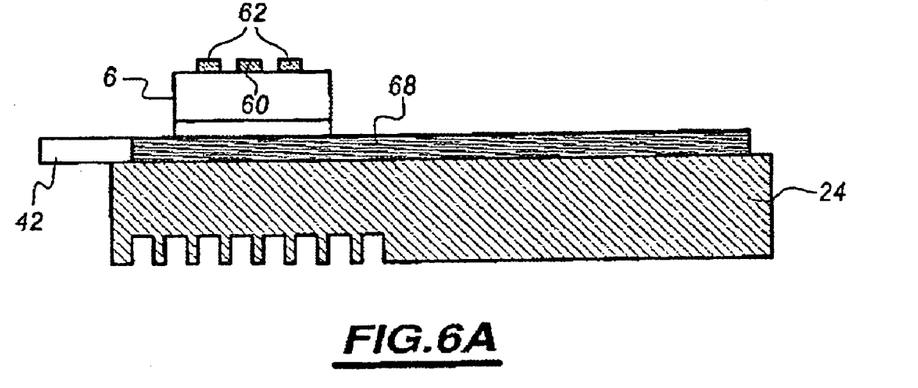

On completion of these operations 106 to 110, the base brick represented in longitudinal section in FIG. 6A is obtained.

Simultaneously with this step 104, a step 116 of fabricating intermediate bricks is performed. This step 116 comprises the same operations as step 104, as well as an additional operation 114 consisting in cutting out from the support the two holes 73 each intended to receive a transistor or a diode. These holes cross right through the thickness of the support and are fashioned on the side opposite to that where the transistor and the diode are brazed. During the operation 110 of step 116, no tag 42 is soldered.

Figure 6B:
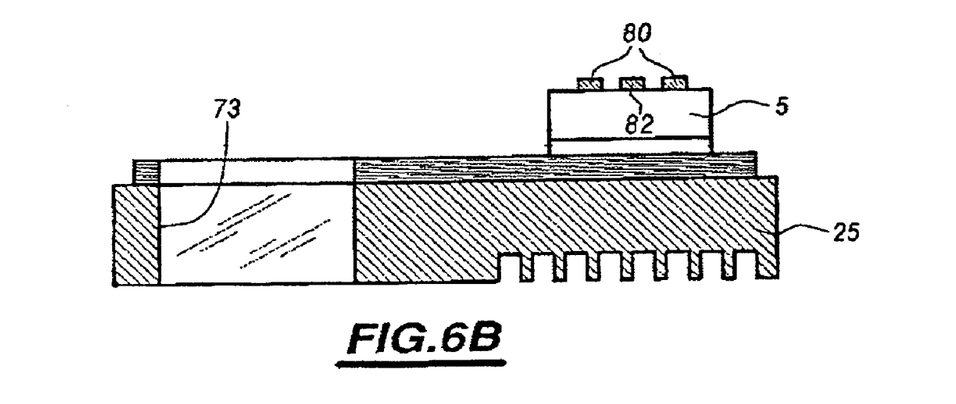

Thus, on completion of step 116, an intermediate brick represented in FIG. 6B is obtained, corresponding for example to the sheet 25 associated with the transistor 5 of FIG. 4.

Likewise in parallel with steps 104 and 116, a step 118 of fabricating end bricks intended to be placed at the upper end of the stack of sheets is performed. This step 118 is identical to step 104 with the exception of the fact that the step 110 is replaced by step 114 and that an operation 119 of linking the bonding tag 44 is performed. On completion of this step 118, an end brick similar to the sheet 27 associated with the tag 44 is obtained.

During this phase 100, a large quantity of elementary bricks are fabricated and stored without foretelling, at this stage of the fabrication, whether these elementary bricks will subsequently be used to fabricate switching cells comprising 2, 3, 4 or more transistors in series.

During phase 102, a layer of the insulating resin 74 is deposited, during a step 120, on the upper face of the base brick in such a way as to electrically insulate the track 68 from the outside environment. In particular, this layer is intended to electrically insulate the track 68 of the group of channels 31.

Once this step 120 has terminated, glue (not represented) is distributed during a step 121, on the upper face of the base brick. This glue is disposed in such a way as to ensure the fixing on this upper face of an intermediate brick.

Subsequently, an intermediate brick is stacked, during a step 122, onto the base brick so that the transistor brazed to the base brick is housed inside the hole 73 fashioned in the intermediate brick.

Figure 6C:
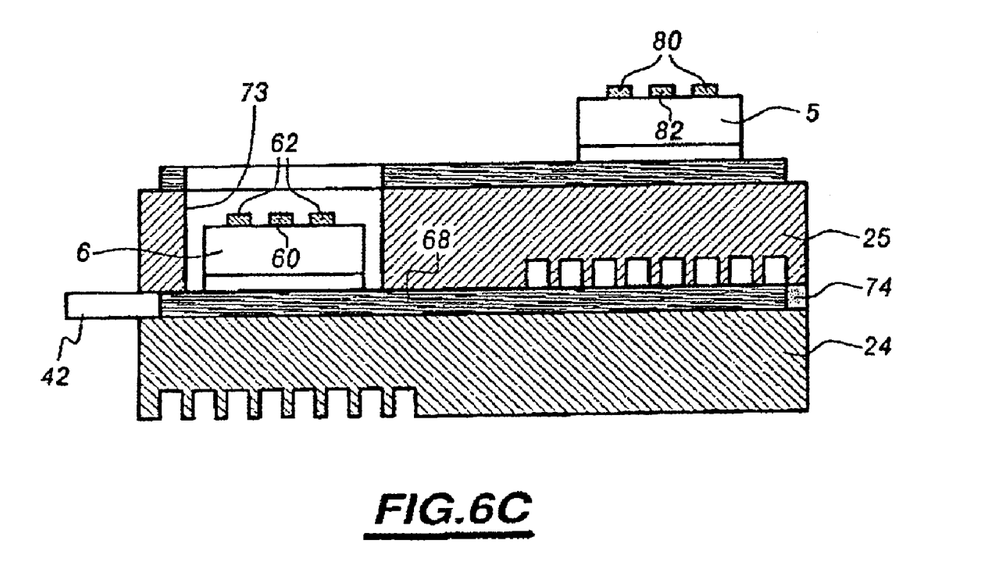
Figure 6D:
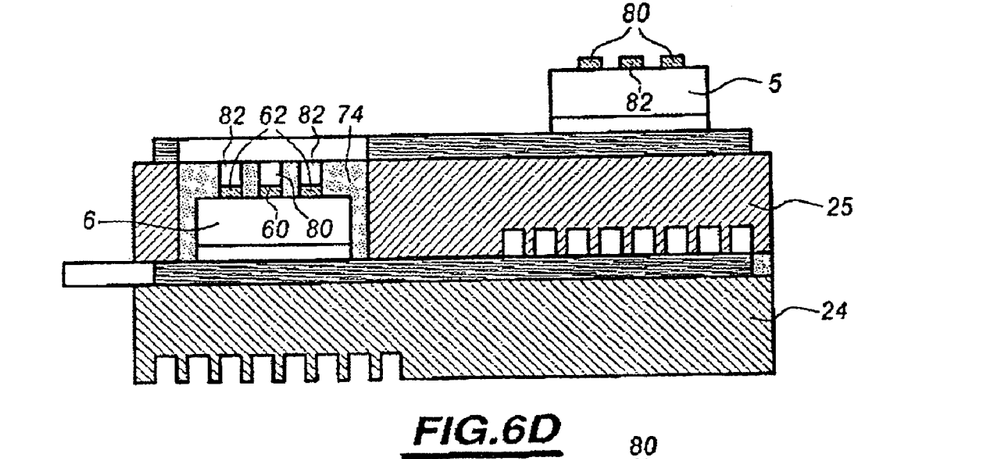

On completion of step 122, the assemblage of FIG. 6C is obtained, this assemblage corresponding for example to the stacking of sheet 25 on sheet 24.

The resin 74 of insulating dielectric material, such as an epoxy resin, is deposited, during a step 124, inside the hole 73 in which the transistor 6 is housed so as to electrically insulate the latter from its environment and then, during a step 126, the wells 80 and 82 are hollowed out in the insulating resin. This step 126 is, for example, performed by a screen-printing process or a process known by the term "dispensing". The assemblage obtained on completion of this step 126 is that of FIG. 6D.

Figure 6E:
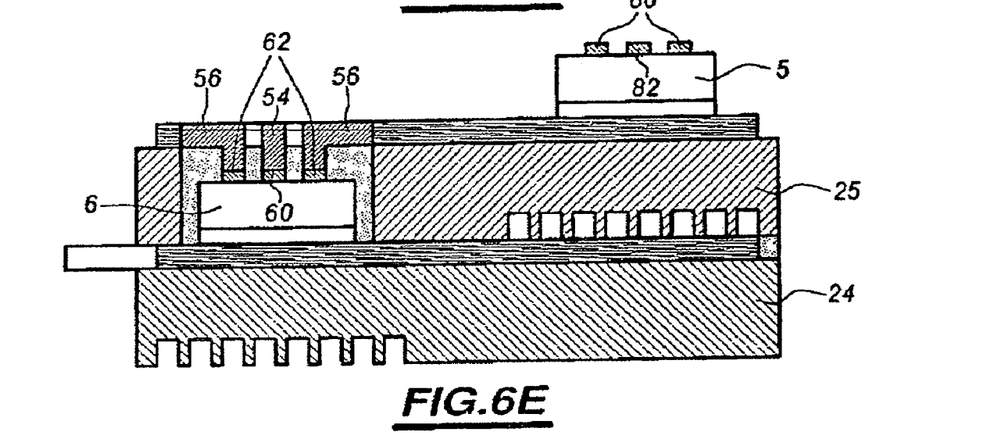
Figure 6F:
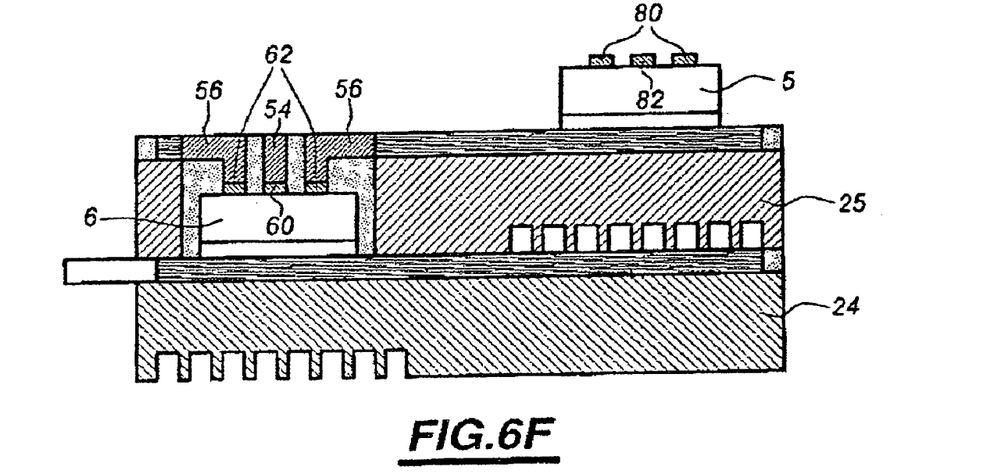

Copper is thereafter deposited, during a step 128, in the wells 80 and 82 as well as on the upper face of the sheet 25 in such a way as to form the bonding points 54, 56 and 58 for connection with the corresponding tracks etched on the upper face of the sheet 25. The result obtained on completion of this step is represented in FIG. 6E.

Finally, during a step 130, a new layer of the resin 74 is spread on the upper face of the sheet 25 in such a way as to insulate the tracks and the electrical bonding points and to ensure the flatness of the upper face of the stack intended to receive the next brick.

On completion of step 130, steps 121 to 130 are repeated in the particular case of the stacking of a new intermediate brick on those already stacked. Steps 121 to 130 are therefore repeated as many times as there are components in the chain 2, that is to say here three times in all. It will be noted, however, that during the last repetition of steps 121 to 130, it is not an intermediate brick that is stacked in a similar manner to what was described with regard to steps 121 to 130 but an end brick.

Thus, by virtue of this process, elementary bricks may be fabricated and stored without foretelling their use in advance.

A switching cell fabricated, for example, according to the process of FIG. 5 also exhibits the advantage of having groups of cooling fluid circulating channels fashioned above and beneath each power component so that these power components are cooled both via their lower face and their upper face. By virtue thereof, the cooling of the power components is more effective and the electrical performance of the cell is thereby improved.

The cell 20 has been described here in the particular case where the intermediate bonds 7 and 8 are not accessible from outside the substrate 22. However, as a variant, in a similar manner to what was described in respect of the linking to the gate of the transistor, for each intermediate bond, a tag projecting from the rear face of the substrate 22 is linked to this intermediate bond. Such a variant is particularly advantageous when the cell comprises an even number of transistors in series and when this additional tag is linked to the intermediate bond situated in the middle of the chain so as to form a midpoint. Such a switching cell then on its own forms an arm of an inverter.

The cell 20 has been described here in the particular case where the power components are formed of diodes and of transistors. However, as a variant, these components may be replaced with other components suitable for switching currents or voltages such as, for example, thyristors.

What is claimed is:

1. A power switching cell comprising at least two power components incorporated in a substrate, said substrate being formed of a stack of sheets of dielectric material, each of said at least two power components being incorporated in the thickness of a different sheet of said stack of sheets of dielectric material, each of said at least two power components exhibiting a first face equipped with at least one point of electrical connection and also exhibiting one opposite second face equipped with at least one other point of electrical connection, said at least two power components forming a chain of power components electrically linked in series by way of at least one intermediate electrical connection, said at least one intermediate electrical connection being entirely incorporated inside said substrate, said at least one intermediate electrical connection electrically connecting said second face of one of said at least two power components to said first face of the other of said at least two power components in said chain of power components, said faces of said at least two power components that are unlinked to said at least one intermediate electrical connection being situated at the ends of said chain of power components so as to be disposed in such a way as to be separated from one another by means of said stack of sheets of dielectric of which said substrate is formed.

2. The power switching cell as claimed in claim 1, wherein said faces of said at least two power components that are unlinked to said at least one intermediate electrical connection being situated at the ends of said chain of power components so as to point in different directions such that the shortest path between said faces of said at least two power components that are unlinked to said at least one intermediate electrical connection crosses said stack of sheets of dielectric material of which said substrate is formed and in which said at least two power components are incorporated.

3. The power switching cell as claimed in claim 1, wherein said first face and said second face of each of said at least two power components are disposed in parallel relationship to the faces of said stack of sheets of dielectric material of which said substrate is formed and in which said at least two power components are incorporated.

4. The power switching cell as claimed in claim 3, wherein at least one of said first face and of said second face of each of said at least two power components is flush with one side of that particular sheet of said stack of sheets of dielectric material of which said substrate is formed in which each of said two power components is incorporated.

5. The power switching cell as claimed in claim 1, wherein said intermediate electrical connection between said at least two power components is formed by an electrical track that is etched on at least one of the faces of that particular sheet of said stack of sheets of dielectric material of which said substrate is formed in which one of said two at least power components is incorporated.

6. The power switching cell as claimed in claim 5, wherein at least one of said at least two power components of said chain of power components is soldered to said etched electrical track.

7. The power switching cell as claimed in claim 1, wherein said power switching cell further includes at least one channel provided inside said substrate so as to be operative for circulating a cooling fluid therethrough in order to enable at least one of said at least two power components incorporated in said substrate to be cooled by said circulating cooling fluid.

8. The power switching cell as claimed in claim 7, wherein said power switching cell includes several channels for circulating a cooling fluid therethrough, and wherein each of said at least two power components is interposed between at least two of said several channels in such a way that said first face and said second face of each of said at least two power components are cooled by the cooling fluid circulating in said several channels.

9. The power switching cell as claimed in claim 8, wherein at least one of said several channels for circulating a cooling fluid therethrough is provided in each sheet of said stack of sheets of dielectric material of which said substrate is formed.

10. The power switching cell as claimed in claim 9, wherein said at least one of said several channels is provided in each sheet of said stack of sheets of dielectric material of which said substrate is formed such as to be situated beneath the one of said at least two power components that is soldered on the face of the particular sheet of said stack of sheets of dielectric material of which said substrate is formed to which said one of said at least two power components is soldered.

11. The power switching cell as claimed in claim 1, wherein:
said substrate formed from said stack of sheets of dielectric material has at least one first opposing face and one second opposing face,
said power switching cell further includes a power electrical connection tag linked to said first face of one of said at least two power components of said chain of power components and a second power electrical connection tag linked to the second face of the other of said at least two power components of said chain of power components, and
said first power electrical connection and said second power electrical connection tag project respectively from said first opposing face and from said second opposing face of said substrate.

12. The power switching cell as claimed in claim 11, wherein:
said substrate has a third face different from said first opposing face and from said second opposing face of said substrate,
said power switching cell further includes at least one third power electrical connection tag linked to said at least one intermediate electrical connection, and
said third power electrical connection tag projects from said third face of said substrate.

13. The power switching cell as claimed in claim 1, wherein said at least two power components are each power transistors.

14. The power switching cell as claimed in claim 1, wherein said substrate is of parallelepipedal shape.

15. The power switching cell as claimed in claim 1, wherein the sheets of said stack of sheets of dielectric material of which said substrate is formed, incorporating said at least two power components, are all of identical size.

* * * * *